United States Patent
Powell et al.

(10) Patent No.: US 7,884,278 B2
(45) Date of Patent: Feb. 8, 2011

(54) APPARATUSES AND METHODS TO REDUCE SAFETY RISKS ASSOCIATED WITH PHOTOVOLTAIC SYSTEMS

(75) Inventors: Earl G. Powell, Sunnyvale, CA (US); Ron Hadar, Cupertino, CA (US); Dan Kikinis, Saratoga, CA (US); Shmuel Arditi, Los Gatos, CA (US)

(73) Assignee: Tigo Energy, Inc., Los Gatos, CA (US)

( * ) Notice: Subject to any disclaimer, the term of this patent is extended or adjusted under 35 U.S.C. 154(b) by 159 days.

(21) Appl. No.: 12/254,780

(22) Filed: Oct. 20, 2008

(65) Prior Publication Data

US 2009/0114263 A1  May 7, 2009

Related U.S. Application Data

(60) Provisional application No. 61/001,587, filed on Nov. 2, 2007.

(51) Int. Cl.
*H01L 31/00* (2006.01)

(52) U.S. Cl. .................................................... 136/244

(58) Field of Classification Search .......... 136/243–265
See application file for complete search history.

(56) References Cited

U.S. PATENT DOCUMENTS

| | | | |
|---|---|---|---|
| 5,143,556 A | 9/1992 | Matlin | |
| 5,235,266 A | 8/1993 | Schaffrin | |
| 5,268,832 A | 12/1993 | Kandatsu | |
| 5,280,133 A | 1/1994 | Nath | |
| 5,604,430 A | 2/1997 | Decker et al. | |
| 5,923,158 A | 7/1999 | Kurokami et al. | |
| 6,031,736 A * | 2/2000 | Takehara et al. | 363/98 |
| 6,093,885 A | 7/2000 | Takehara et al. | |
| 6,101,073 A | 8/2000 | Takehara et al. | |
| 6,275,016 B1 | 8/2001 | Ivanov | |
| 6,396,239 B1 | 5/2002 | Benn et al. | |
| 6,448,489 B2 | 9/2002 | Kimura et al. | |

(Continued)

FOREIGN PATENT DOCUMENTS

AU  2005262278  7/2005

(Continued)

OTHER PUBLICATIONS

Advanced Energy Group, "The Basics of Solar Power Systems," located at http://web.archive.org/web/20010331044156/http://www.solar4power.com/solar-power-basics.html, Mar. 31, 2001.

(Continued)

*Primary Examiner*—Jeffrey T Barton
(74) *Attorney, Agent, or Firm*—Greenberg Traurig, LLP

(57) ABSTRACT

Apparatuses and methods to reduce safety risks associated with photovoltaic systems by providing a safety switch on a photovoltaic panel. In one embodiment, a photovoltaic panel includes: at least one photovoltaic cell; a connector to output energy from the photovoltaic panel; and a switch coupled between the at least one photovoltaic cell and the connector. The switch is configured to disconnect the at least one photovoltaic cell from the connector during installation of the photovoltaic panel, and to connect the at least one photovoltaic cell with the connector after installation of the photovoltaic panel.

8 Claims, 6 Drawing Sheets

U.S. PATENT DOCUMENTS

| | | | |
|---|---|---|---|
| 6,515,215 | B1 | 2/2003 | Mimura |
| 6,545,211 | B1 | 4/2003 | Mimura |
| 6,593,520 | B2 | 7/2003 | Kondo et al. |
| 6,650,031 | B1 | 11/2003 | Goldack |
| 6,653,549 | B2 | 11/2003 | Matsushita et al. |
| 6,837,739 | B2 | 1/2005 | Gorringe et al. |
| 6,844,739 | B2 | 1/2005 | Kasai et al. |
| 6,894,911 | B2 | 5/2005 | Telefus et al. |
| 6,897,370 | B2 * | 5/2005 | Kondo et al. ............... 136/243 |
| 6,984,970 | B2 | 1/2006 | Capel |
| 7,061,214 | B2 | 6/2006 | Mayega |
| 7,150,938 | B2 | 12/2006 | Munshi et al. |
| 7,248,946 | B2 | 7/2007 | Bashaw et al. |
| 7,256,566 | B2 | 8/2007 | Bhavaraju et al. |
| 7,276,886 | B2 | 10/2007 | Kinder |
| 7,518,346 | B2 | 4/2009 | Prexl |
| 7,595,616 | B2 | 9/2009 | Prexl et al. |
| 7,605,498 | B2 | 10/2009 | Ledenev et al. |
| 7,719,140 | B2 | 5/2010 | Ledenev et al. |
| 2005/0057214 | A1 | 3/2005 | Matan |
| 2005/0057215 | A1 | 3/2005 | Matan |
| 2006/0001406 | A1 | 1/2006 | Matan |
| 2006/0174939 | A1 | 8/2006 | Matan |
| 2006/0185727 | A1 | 8/2006 | Matan |
| 2006/0231132 | A1 | 10/2006 | Neussner |
| 2007/0273351 | A1 | 11/2007 | Matan |
| 2008/0121272 | A1 | 5/2008 | Besser et al. |
| 2008/0122449 | A1 | 5/2008 | Besser et al. |
| 2008/0122518 | A1 | 5/2008 | Besser et al. |
| 2008/0142071 | A1 | 6/2008 | Dorn et al. |
| 2008/0179949 | A1 | 7/2008 | Besser et al. |
| 2008/0191560 | A1 | 8/2008 | Besser et al. |
| 2008/0191675 | A1 | 8/2008 | Besser et al. |
| 2008/0303503 | A1 | 12/2008 | Wolfs |
| 2010/0139734 | A1 | 6/2010 | Hadar et al. |

FOREIGN PATENT DOCUMENTS

| | | | |
|---|---|---|---|
| DE | 4232356 | | 3/1994 |
| DE | 19961705 | | 7/2001 |
| EP | 1388774 | | 2/2004 |
| ES | 2249147 | | 3/2006 |
| JP | 4219982 | | 8/1992 |
| JP | 8097460 | | 4/1996 |
| JP | 8116628 | | 5/1996 |
| JP | 8316517 | | 11/1996 |
| JP | 9148611 | | 6/1997 |
| JP | 11103538 | | 4/1999 |
| JP | 2000358330 | | 12/2000 |
| JP | 2003134661 | A1 * | 5/2003 |
| WO | 03012569 | | 2/2003 |

OTHER PUBLICATIONS

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Euronsun 96, pp. 819-824, Sep. 16, 1996.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Alonso, R. et al., "A New Distributed Converter Interface for PV Panels," 20th European Photovoltaic Solar Energy Conference, Barcelona, Spain, pp. 2288-2291, Jun. 6-10, 2005, Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

Roman, Eduardo, et al., "Intelligent PV Module for Grid-Connectred PV Systems," IEEE Transactions on Industrial Electronics, vol. 53, No. 4, pp. 1066-1073, Aug. 2006.

Walker, Jeffrey R. et al., "Cascaded DC-DC Converter Connection of Photovoltaic Modules," IEEE Transactions on Power Electronics, vol. 19, No. 4, pp. 1130-1139, Jul. 2004.

Basso, Tim, "IEEE Standard for Interrconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Gautam, Nalin K. et al., "An Efficient Algorithm to Simulate the Electrical Performance of Solar Photovoltaic Arrays," Energy, vol. 27, No. 4, pp. 347-361, 2002.

International Patent Application PCT/US08/75127, International Search Report and Written Opinion (mailed Apr. 28, 2009).

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Transaction History of related U.S. Appl. No. 12/366,597, filed Feb. 5, 2009, entitled "Apparatuses and Methods to Reduce Safety Risks Associated with Photovoltaic Systems."

Definition of "removable" from Webster's Third New International Dictionary, Unabridged, 1993.

Definition of "remove" from Webster's Third New International Dictionary, Unabridged, 1993.

Hewes, J. "Relays," located at http://web.archive.org/web/20030816010159/www.kpsec.freeuk.com/components/relay.htm, Aug. 16, 2003.

International Patent Application No. PCT/US2008/081827, International Search Report and Written Opinion, Jun. 24, 2009.

Wiles, John, "Photovoltaic Power Systems and the National Electrical Code: Suggested Practices," Sandia National Laboratories, document No. SAND2001-0674, Mar. 2001.

* cited by examiner

APPARATUSES AND METHODS TO REDUCE SAFETY RISKS ASSOCIATED WITH PHOTOVOLTAIC SYSTEMS

RELATED APPLICATIONS

The present application claims priority to provisional U.S. patent application Ser. No. 61/001,587, filed on Nov. 2, 2007 and entitled "Photovoltaic Safety Switch," the disclosure of which is hereby incorporated herein by reference.

FIELD OF THE TECHNOLOGY

At least some embodiments disclosed herein relate to photovoltaic systems in general and, more particularly but not limited to, safety devices for the shipment, installation and/or maintenance of photovoltaic systems.

BACKGROUND

When a photovoltaic panel or laminate is exposed to direct or diffuse light, a lethal voltage potential may be present. In the United States the possible voltage could be as high as 600 volts, while in Europe and the rest of the world this voltage could approach a kilovolt.

Because of this potential danger from electrical shock, solar panel manufacturers and code and standards development organizations have made some recommendations to minimize or eliminate this danger.

One suggestion has been to cover the photovoltaic panel with an opaque material such as a tarpaulin. However, this approach proposes its own safety risk from having the wind catch the tarpaulin and pull installation personnel off the roof as they try to control the unstable sheet material against the wind.

Another recommendation is to install and/or service the photovoltaic panels at night when there is minimal risk of the panels being energized. This approach presents the potential safety risks associated from working in a poorly lighted environment.

In addition to the potential personnel safety issues there are also significant risks to equipment and hardware. Connecting or disconnecting energized plugs can cause arcing and damage to these connectors, junction boxes, and other electrical components.

SUMMARY OF THE DESCRIPTION

Apparatuses and methods to reduce safety risks associated with photovoltaic systems by providing a safety switch on a photovoltaic panel. Some embodiments are summarized in this section.

In one embodiment, a photovoltaic panel includes: at least one photovoltaic cell; a connector to output energy from the photovoltaic panel; and a switch coupled between the at least one photovoltaic cell and the connector. The switch is configured to disconnect the at least one photovoltaic cell from the connector during installation of the photovoltaic panel, and to connect the at least one photovoltaic cell with the connector after installation of the photovoltaic panel.

In one embodiment, the photovoltaic panel further includes a junction box to host the connector, wherein the switch is integrated in the junction box.

In one embodiment, the switch includes a first conductive contactor, a second conductive contactor, and a removable portion which when removed connect the at least one photovoltaic cell with the connector. For example, the removable portion may include a dielectric separator; when the dielectric separator is inserted between the first and second contactor, the switch is not connected; and when the dielectric separate is removed, the switch is connected. In one embodiment, the first and second conductive contactors are spring loaded toward each other.

In one embodiment, the removable portion further includes a flag attached to the dielectric separator. The flag may have a visual indication of warning for electric shock.

In one embodiment, the switch includes a reed switch; and the removable portion includes a magnet. The reed switch may be a normally closed reed switch, or normally open reed switch.

In one embodiment, the switch includes an optical sensor to turn on or off the switch based on light detected by the optical sensor; and the removable portion includes a pull-tab configured to shield the optical sensor. The at least one photovoltaic cell may be used to power the optical sensor.

In one embodiment, the switch further includes a semiconductor switch device (e.g., a Field-Effect Transistor (FET)) or a relay.

In one embodiment, the switch includes a relay and a wiring connector to control the relay from a remote location.

In one embodiment, the photovoltaic panel further includes a circuit to detect a load from an inverter. The switch is to connect an output of the photovoltaic panel to the connector when the circuit detects a load from an inverter and to disconnect the output in absence of a load from an inverter.

In one embodiment, a photovoltaic panel module includes: a voltage module to adjust an output of a plurality of photovoltaic cells; and a switch coupled the voltage module to selectively provide the output. In one embodiment, the voltage module outputs an alternating current (AC) output. The switch may include a semiconductor switch, a relay, a reed switch, a spring loaded switch, and/or an optical sensor to control a state of the switch.

In one embodiment, the photovoltaic panel module further includes connectors for wirings to control a state of the switch.

The disclosure includes methods and apparatuses which perform these methods, including data processing systems which perform these methods, and computer readable media containing instructions which when executed on data processing systems cause the systems to perform these methods.

Other features will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

One embodiment of the disclosure provides a method and system to reduce the safety risks during the shipment, installation and/or maintenance of photovoltaic systems, without introducing the risks associated with other approaches, such as covering them with an opaque material or working on them at night.

In one embodiment, safety protection is provided via the inclusion of a normally closed switch integral to the panel junction box or integral to the panel module when alternating current (AC) or direct current (DC) modules are used.

Figure 1:
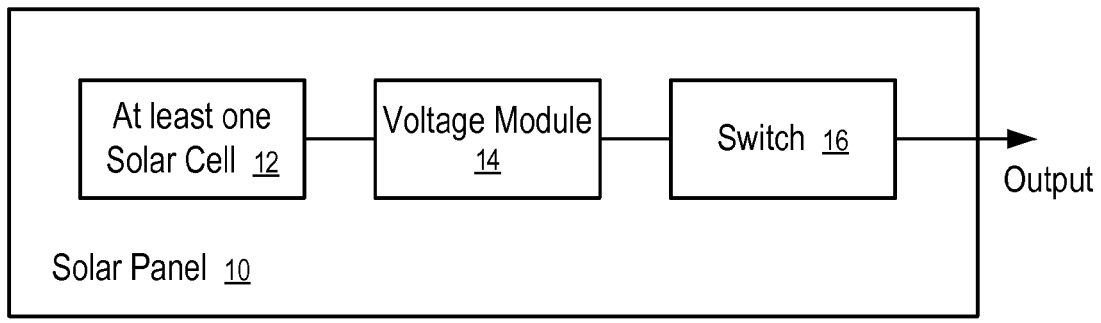
FIG. 1 illustrates a solar panel having a safety switch according to one embodiment.

FIG. 1 illustrates a solar panel having a safety switch according to one embodiment. In FIG. 1, a solar panel 10 (e.g., a photovoltaic panel) includes at least one solar cell 12 (e.g., a photovoltaic cell) to generate power when exposed to direct or diffuse light, in some cases a voltage module 14 to adjust or regulate the output voltage (or in some other cases a current module to regulate current), and a switch 16 to selectively isolate the solar cell 12 from the output connectors of the solar panel. In yet other cases, the switch may be incorporated into regulator modules, such as voltage module 14.

In one embodiment, the switch 16 is a normally closed switch. During the shipment, installation and/or maintenance, the switch 16 is placed in an open state to isolate the solar cell 12 from the output. After the installation or maintenance, the switch 16 is placed into a closed state to allow the solar cell 12 to energize the output connectors of the solar panel and to supply power through the output connectors of the solar panel.

The switch 16 and the voltage module can be integrated into the junction box of the solar panel. In some embodiment, the switch 16 is integrated with the voltage module 14 as a panel module.

FIGS. 2-5 illustrate a spring loaded safety switch for a photovoltaic panel according to one embodiment. In FIGS. 2-5, the switch includes two contactors 102 and 103 made of a conductive metal or plated hybrid. The contactors 102 and 103 are normally made of a spring alloy metal or have an integral spring plunger design (not shown). The contactors 102 and 103 are positioned or fixed in such a way that the two contacts 102 and 103 are spring loaded toward each other to maintain electrical continuity between the two contactors 102 and 103. Thus, the switch is normally closed (NC) and not in a safe mode for installation or maintenance.

Figure 2:
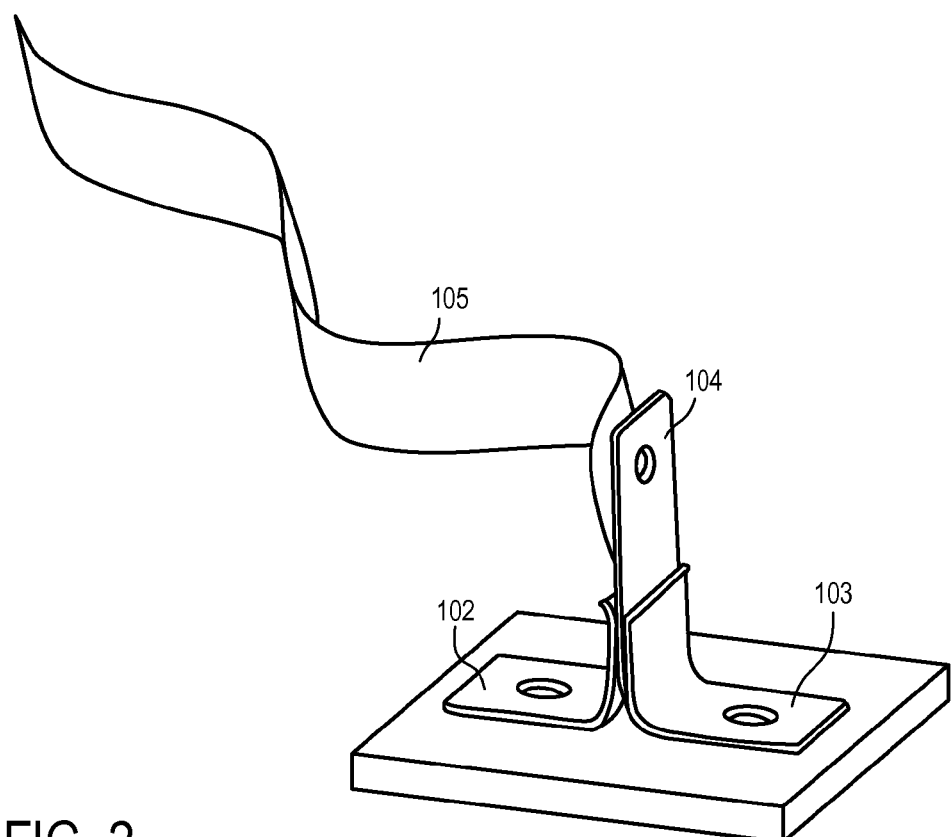
FIGS. 2-5 illustrate a spring loaded safety switch for a photovoltaic panel according to one embodiment.

In FIG. 2, a safe mode for installation or maintenance is achieved when the blade 104 is inserted between the two contactors 102 and 103. The blade 104 is manufactured from a dielectric material and when inserted between the two contactors 102 and 103 there is no electrical continuity between the contactors 102 and 103.

As illustrated in FIG. 2, the blade 104 may also have a flag 105 attached. The flag 105 could be red or some other highly visible color, to provide a visual indicator of the state of the panel.

In one embodiment, the panels and/or panel with integral modules would come shipped from the factory with the blade 104 and the flag 105, where the blade 104 is inserted between the two contactors 102 and 103. The panels would be installed and integrated with the blade 104 present and flag 105 visible. The installer would mount, secure, and plug in all of the connections in the system, including the grounding.

Figure 3:
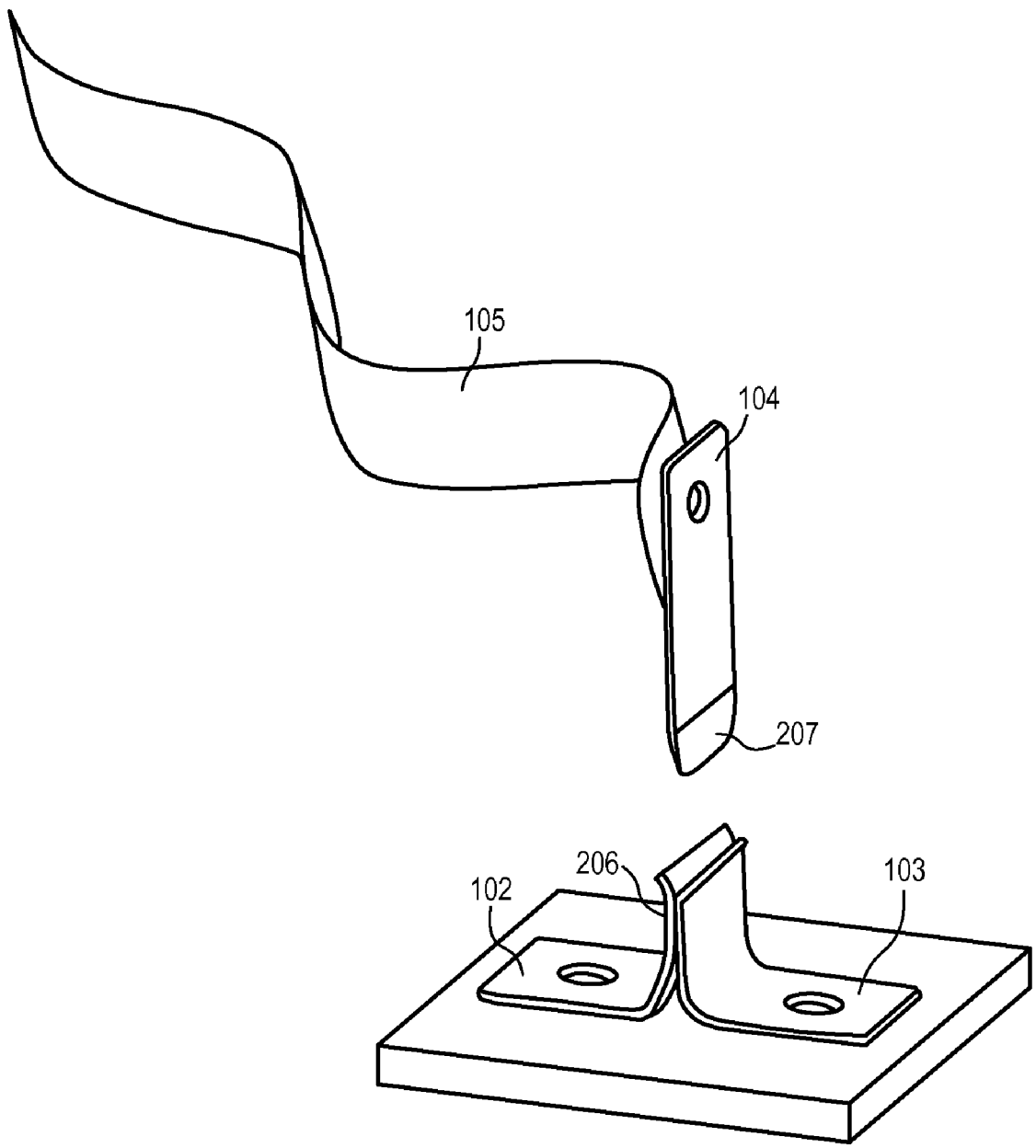

As illustrated in FIG. 3, once the installation is completed the installer would remove the blades 104 at all those places indicated by the flags 105. Once the blade 104 is removed, the spring loaded contactors 102 and 103 contact each other to provide an electric path from the photovoltaic cells to the output connectors of the photovoltaic panel.

If additional work or troubleshooting were needed, the blade(s) 104 and flag(s) 105 could be reinserted, aided by the tapered section 207 of the blade 104, thereby breaking the electrical continuity between the contactors 102 and 103 at point 206.

In some embodiments, there is symmetry in contactors 102 and 103. In other embodiments, the contactors 102 and 103 are not identical or even similar. The contactors 102 and 103 are made of electrically conductive material and configured to be in physical contact with each so that an electrically conductive path 206 is maintained, after the blade 104 is removed. In at least some embodiments, the electrical conductive path 206 is maintained without the blade 104 being inserted between the contactors 102 and 103, then disrupted by the blade 104 inserted between the contactors 102 and 103, and then reestablished by the reinsertions of a dielectric device such as the blade 104.

In addition to the visual indication of the modes of the panels provided by the flag(s) 105, the flags could also provide information in the form of text, such as, for example, "Remove before operation" or a warning of potentially lethal voltage.

Figure 4:
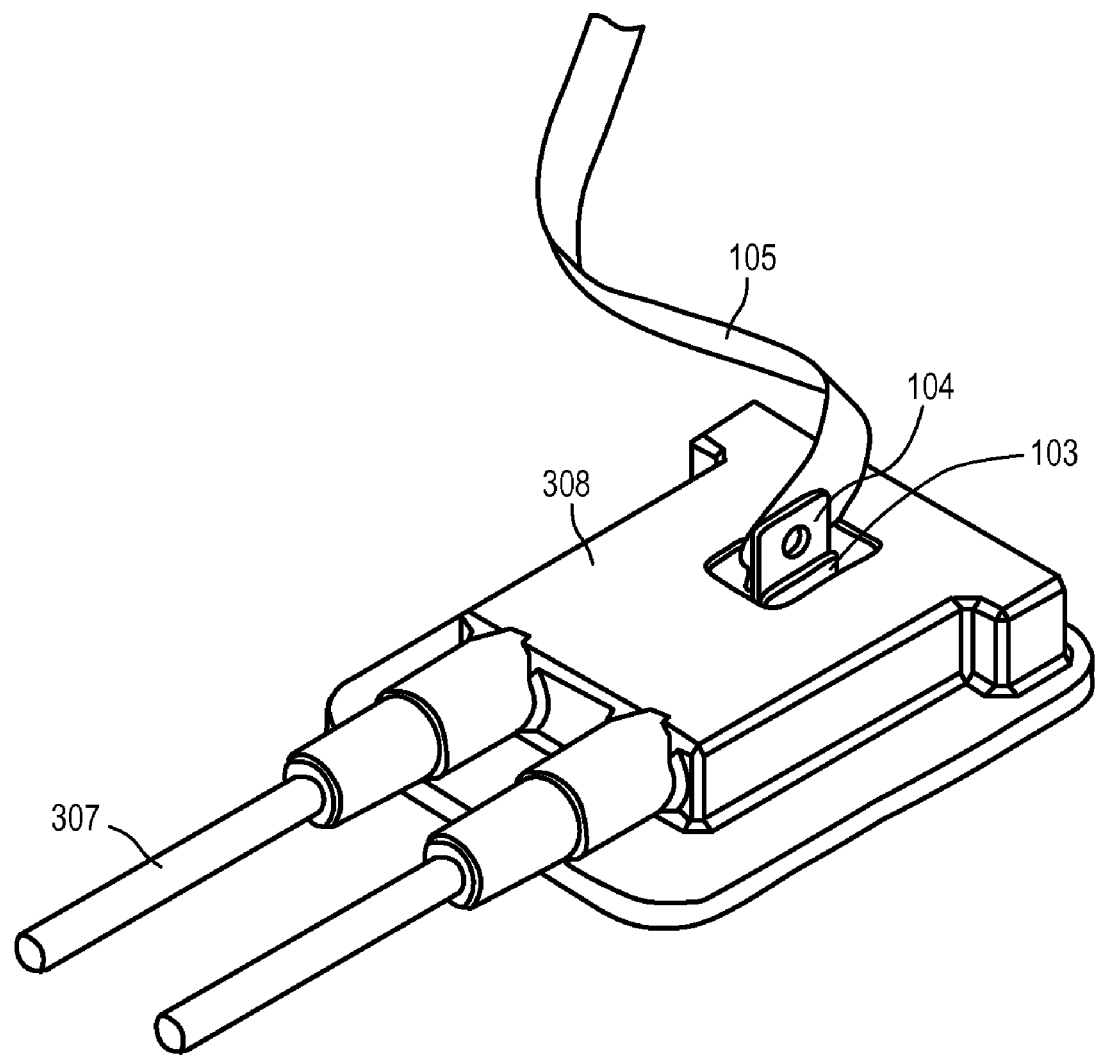

FIG. 4 illustrates a configuration of a spring loaded switch integrated with a junction box 308 of a photovoltaic panel. The junction box 308 includes a connector to connect the solar power generated by the photovoltaic panel to a load (e.g., an inverter, a voltage bus, etc.) via a cable 307. Thus, when the blade 104 is inserted into the switch, with the flag 105 visible, the voltage generated by the solar cells is isolated from the connector for the cable 307; and thus it is safe to install the photovoltaic panel or to perform maintenance operations on the photovoltaic panel.

Figure 5:
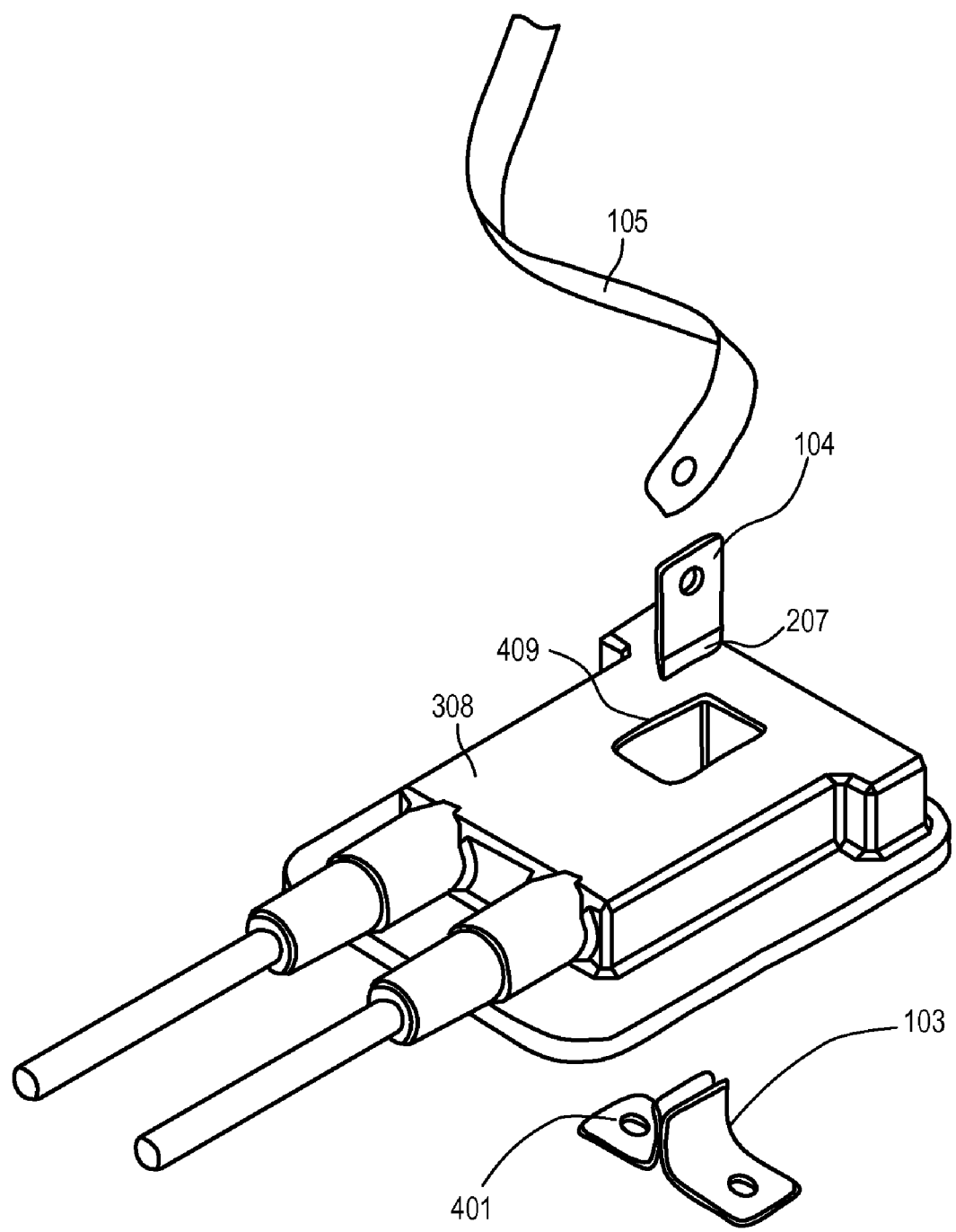

FIG. 5 shows the components of the spring loaded switch and the junction box of a photovoltaic panel. As illustrated in FIG. 5, the junction box 308 has an opening 409, which provides access to remove the blade 104 and/or to re-insert the blade 104. The contactors 103 of the switch can be attached to the junction box 308 via fastening the portion 401 to a supporting member of the junction box 308, such as a printed circuit board (PCB).

Figure 6:
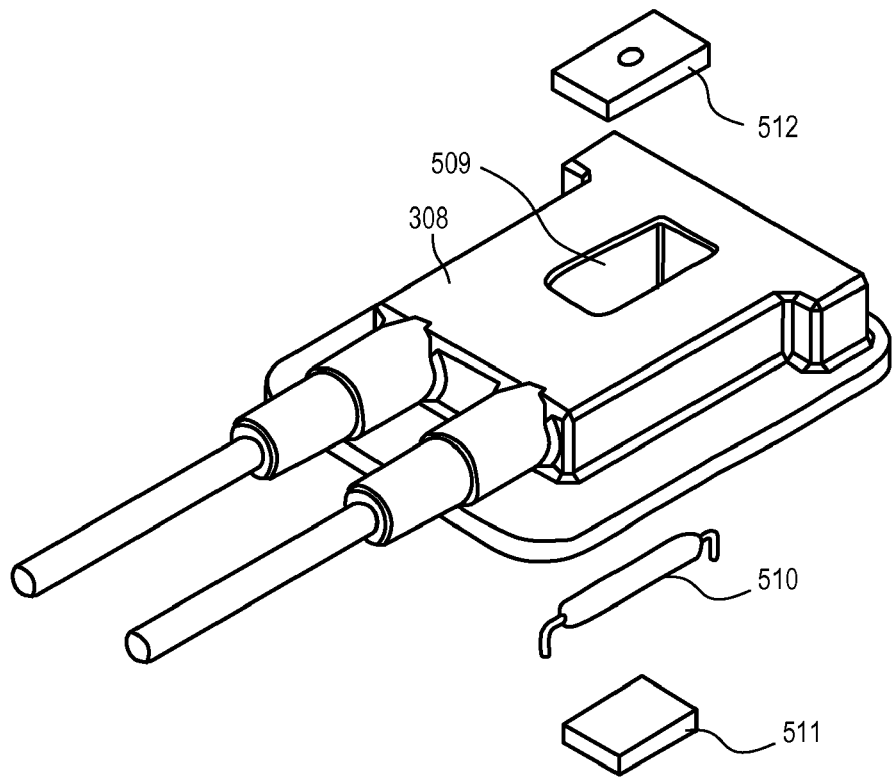
FIGS. 6-7 illustrate a junction box with a reed switch for a photovoltaic panel according to one embodiment.
Figure 7:
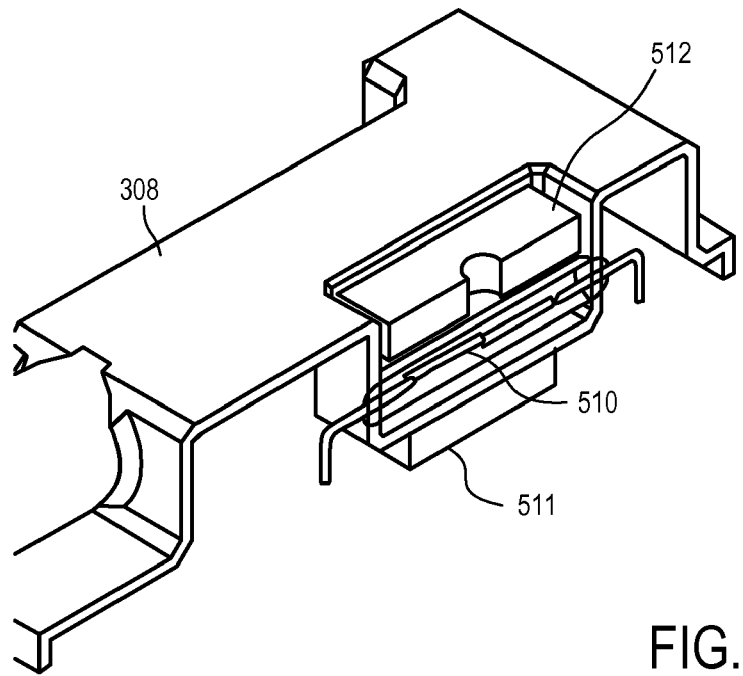

FIGS. 6-7 illustrate a junction box with a reed switch for a photovoltaic panel according to one embodiment. FIG. 6 shows an assembly of a reed switch 510 and magnets for integrated into the photovoltaic junction box 308. FIG. 7 shows a cut-away section illustrating the reed switch 510 and the magnets 511 and 512 installed within the portion 509 of the junction box 308.

In FIG. 7, a reed switch 510 is made normally closed by integrating a stationary biasing magnet 511 into the junction box 308 in close proximity to the normally open reed switch, so that the switch 510 is closed in absence of the magnet 512.

In one embodiment, the magnet 512 is inserted into the junction box well 509 so that the reversed polarity cancels the magnetic lines of force and the reed switch 510 opens.

In one embodiment, the magnet 512 is installed in the junction box well 509 at the factory; and a flag 105 (not shown in FIGS. 6 and 7) is attached to the magnet 512. The magnet 512 is removable and/or re-insertable via the junction box well 509.

In other embodiments, normally closed (NC) reed contacts can be used to replace the normally open (NO) reed contacts 510 and the magnet 511, avoiding the need for the additional stationary magnet.

Once the installation and integrations are complete the magnet 512 is removed and may be discarded. The power leads of the junction box 308 can then be energized via the semiconductor switch or relay (not shown), when the reed switch 512 is in the closed state.

In some cases, a semiconductor switch (not shown in FIG. 7) can be used to energize the power leads of the junction box 308. The panel junction box 308 or inverter (not shown in FIG. 7) may include a controller unit with a watchdog circuit configured to send a signal periodically (e.g., every time interval t) to maintain the connection of the panel outputs to the string. When this signal is timed-out or is absent, the panel outputs of the panel are disconnected via a semiconductor switch device (not shown).

Figure 8:
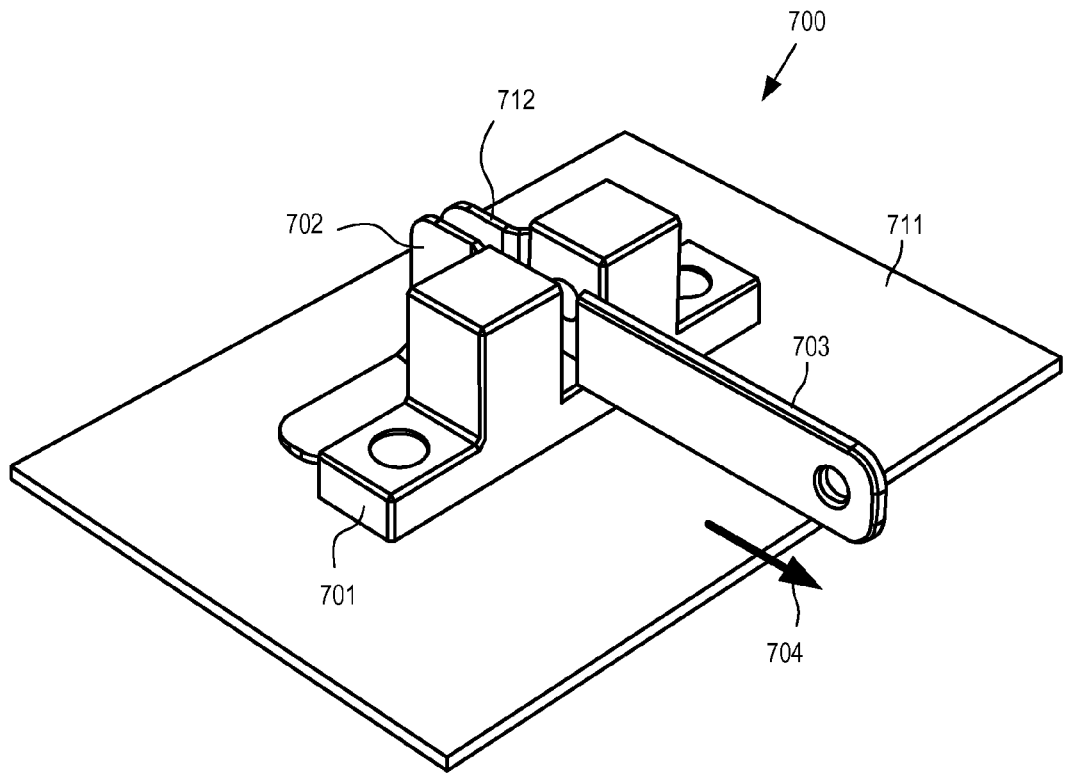
FIG. 8 illustrates an optical sensor to control a safety switch for a photovoltaic panel according to one embodiment.

FIG. 8 illustrates an optical sensor to control a safety switch for a photovoltaic panel according to one embodiment. In FIG. 8, an optical sensor unit 700 with an optical sensor 701 is mounted on a printed circuit board (PCB) 711. Additionally, springs 702 and 712 hold a separator 703 in place that can be removed in direction of arrow 704 using a pull-tab similar to the flag 105 discussed earlier. Not shown in FIG. 8 is the exterior enclosure that would contain the mechanical elements such as the cable connections and the guide elements for guiding separator 703 in and out of the unit.

In one embodiment, additional circuitry (not shown in FIG. 8) will be on the side of the PCB 711, such as a control circuit to affect an on/off switching either in some cases by FET (Field-Effect Transistor) transistors or using, in other cases, a relay, such as a bi-stable relay or another suitable circuit. The operational power may be drawn from the solar system itself, or it may be brought up by auxiliary wiring.

In yet some other embodiments, a relay can be simply remote controlled by an auxiliary wire to close or open the circuit. The advantage of this approach is that no pull-tabs (flags or blades) can be forgotten on the roof.

In one embodiment, a mechanism and/or circuitry is integrated in the panel to identify the load from the inverter and connect the panel to the panel outputs when the load is detected. When no load is present the panel outputs is disconnected. This functionality would also be implemented using a semiconductor switch device or other suitable device (such as a relay), and some sensor circuitry, allowing an automatic reconnect when the loop appears to be closed and a load connected.

Figure 9:
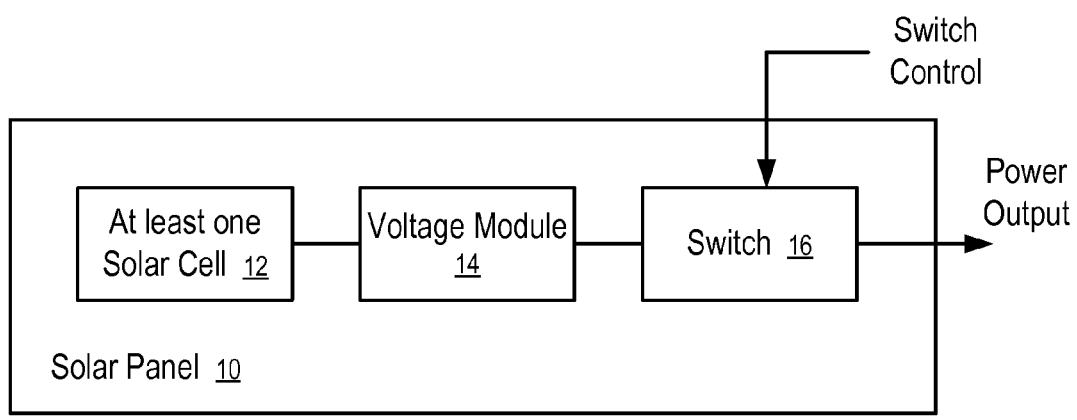
FIG. 9 illustrates a solar panel having a safety switch controlled via auxiliary wiring according to one embodiment.

FIG. 9 illustrates a solar panel having a safety switch controlled via auxiliary wiring according to one embodiment. In FIG. 9, a separate wire is connected to control the switch 16 from a remote location. For example, the switch may be controlled via a signal from a watchdog circuit, from a remote switch or controller, etc.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A photovoltaic panel, comprising:
   a plurality of photovoltaic cells;
   at least one connection terminal configured on the photovoltaic panel to output electricity from the photovoltaic panel;
   a voltage module to adjust an output of the plurality of photovoltaic cells;
   a circuit configured to detect a load from an inverter; and
   a switch coupled between the voltage module and the connection terminal to selectively provide the output through the switch to the connection terminal, the switch configured to disconnect the output in absence of the load detected by the circuit.

2. The photovoltaic panel of claim 1, wherein the voltage module outputs an alternating current (AC) output.

3. The photovoltaic panel of claim 1, wherein the switch comprises one of a semiconductor switch, a relay, a reed switch, and a spring loaded switch.

4. The photovoltaic panel of claim 1, wherein the switch comprises an optical sensor to control a state of the switch.

5. A photovoltaic panel, comprising:
   a plurality of photovoltaic cells;
   a connector to output energy generated by the plurality of photovoltaic cells of the photovoltaic panel;
   a voltage module to adjust an output of at least one photovoltaic cell;
   a circuit to detect a load from an inverter; and
   a switch coupled between the voltage module and the connector and, the switch coupled with the circuit to connect the plurality of photovoltaic cells through the switch to the connector when the circuit detects a load from an inverter and to disconnect the plurality of photovoltaic cells from the connector via the switch when the circuit detects no load from an inverter.

6. The photovoltaic panel of claim 5, further comprising:
   a junction box to host the connector, wherein the switch is integrated in the junction box.

7. The photovoltaic panel of claim 5, wherein the switch comprises a semiconductor switch device or a relay.

8. The photovoltaic panel of claim 7, wherein the semiconductor switch device comprises a Field-Effect Transistor (FET).

* * * * *